United States Patent [19]
Watanabe et al.

[11] Patent Number: 5,144,528
[45] Date of Patent: Sep. 1, 1992

[54] LAMINATE DISPLACEMENT DEVICE

[75] Inventors: Junichi Watanabe, Kumagaya; Takahiro Someji, Fukaya; Yoshiyuki Watanabe, Fukaya; Shigeru Jomura, Tokyo, all of Japan

[73] Assignee: Hitachi Metals, Ltd., Tokyo, Japan

[21] Appl. No.: 762,300

[22] Filed: Sep. 19, 1991

[30] Foreign Application Priority Data

Oct. 1, 1990 [JP] Japan .................... 2-263635

[51] Int. Cl.⁵ .............................. H01G 4/10
[52] U.S. Cl. ................................... 361/321
[58] Field of Search ............... 361/320, 321; 310/332

[56] References Cited

U.S. PATENT DOCUMENTS 4,994,703 2/1991 Oguri et al. ................. 310/363

FOREIGN PATENT DOCUMENTS 247540 12/1987 European Pat. Off. .
58-196068 5/1989 Japan .
2239553 7/1991 United Kingdom .

Primary Examiner—Donald A. Griffin
Attorney, Agent, or Firm—Sughrue, Mion, Zinn, Macpeak & Seas

[57] ABSTRACT

A laminate displacement device comprises a laminate body having a plurality of thin plates made of an electromechanical converting material and a plurality of internal electrodes made of conductive material superposed on each other. The internal electrodes are used for every other electrode alternately as electrodes of first and second conductivity type, respectively. A first insulating layer is formed on one side surface of the laminate body so that the internal electrodes used for the electrodes of first conductivity type are exposed. Further a second insulating layer is formed on another side surface of the laminate body so that the internal electrodes used for the electrodes of second conductivity type are exposed. A pair of external electrodes are formed on the first and second insulating layers, which bridge the internal electrodes used as the electrodes of first and second conductivity type, respectively. The insulating layers are made of a crystalline inorganic material containing Pb converted into PbO of 5.0 to 45.0 wt. %.

4 Claims, 5 Drawing Sheets

F I G. 1A
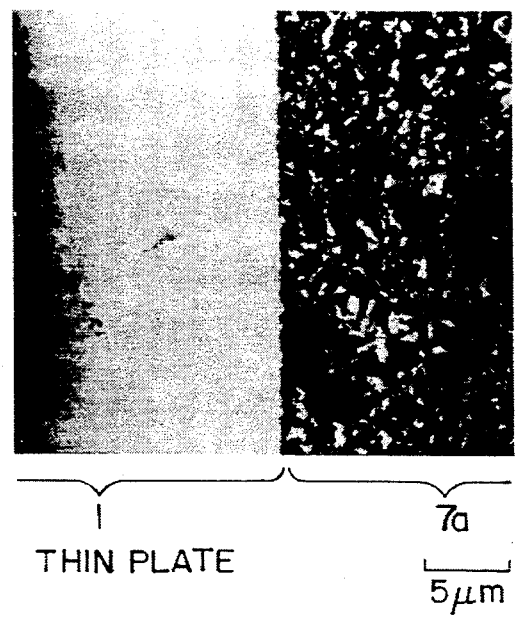
| 1 | 7a |
| THIN PLATE | 5μm |
F I G. 1B
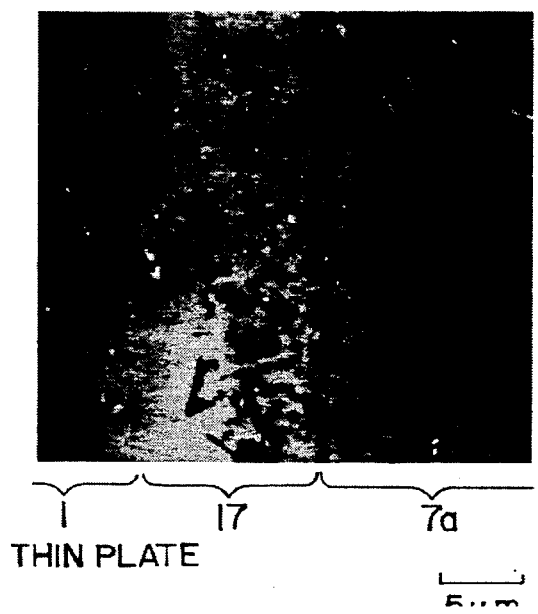
| 1 | 17 | 7a |
| THIN PLATE | | 5μm |

LAMINATE DISPLACEMENT DEVICE

BACKGROUND OF THE INVENTION

The present invention relates to an electromechanical converting device used for an actuator in an industrial robot, an ultrasonic motor, etc., and in particular to an improvement of a laminate displacement device having a displacement increased by laminating a plurality of thin plates made of an electromechanical converting material through internal electrodes.

A laminate piezo-electric device used in a displacement device used for a positioning mechanism, a brake, etc. in an X-Y stage is fabricated by a method, by which an electrode is formed on each of thin plates made of a piezo-electric ceramic material formed in a predetermined shape to polarize it and thereafter they are stuck to each other directly or through thin metallic films with organic adhesive. However a displacement device laminated with adhesive as described above has drawbacks that the adhesive absorbs displacement due to vibration of the piezo-electric elements, depending on use conditions, that the adhesive is deteriorated by high temperature environment or long term use, etc.

For this reason, a laminate displacement device having a laminate chip condenser structure is used in practice. That is, as described e.g. in JP-B-59-32040, a paste-like piezo-electric ceramic material obtained by adding binder to raw material powder and kneading them together is formed in a thin plate having a predetermined thickness and a conductive material such as silver-palladium, etc. is applied on one or both the surfaces of this thin plate to form internal electrodes. A predetermined number of thin plates described above are superposed on each other, bonded with pressure and further formed in a predetermined shape. Thereafter, they are transformed into ceramic by sintering and external electrodes are formed on two side surfaces of a laminate body thus obtained. Since the laminate displacement device thus constructed is excellent in the close adhesion at the junction portion between the thin plates made of the piezoelectric ceramic material and the internal electrodes and at the same time thermal characteristics thereof are stable, it has advantages that it can be used satisfactorily in a high temperature environment, that deterioration is extremely small over a long period of time.

FIG. 3 shows an example of the structure of the laminate displacement device described above, named so-called alternate electrode type. In FIG. 3, reference numeral 1 represents a thin plate made of a piezo-electric ceramic material and a plurality of them are superposed on each other, putting alternately positive and negative internal electrodes 2a and 2b therebetween, to form a laminate body 5. The internal electrodes 2a and 2b are so formed that an insulating portion on one side of the thin plates protrudes outwards or it is exposed and connected with external electrodes 3a and 3b, respectively, extending in the lamination direction, which are in turn connected with leads 6 through solder 7.

By the construction described above, when DC voltage is applied from the external electrodes 3a and 3b, electric field is produced between the internal electrodes 2a and 2b and the thin plate 1 is extended in the thickness direction by the longitudinal effect of the piezo-electric ceramic material, which gives rise to displacement. However, in such a construction, since the electric field intensity is low at the peripheral portions close to the side surfaces, i.e. portions, where the internal electrodes 2a and 2b are not superposed on each other, not only no deformation takes place there but also they hinder deformation of the whole device. Consequently, in such an alternate electrode type device, it is not possible to obtain an amount of strain proper to the electromechanical converting material with a high precision and further stress concentration takes place at the boundary between the displacement portion and the non-displacement portion. Therefore it has a drawback that the device is destroyed by application of a high voltage or by application of a voltage over a long period of time.

As a device, for which the drawback described above is removed, there is known a laminate displacement device, as indicated in FIG. 4, which is designated so-called whole surface electrode type, for which the piezo-electric displacement effect is increased (refer to e.g. JP-A-58-196068, etc.). In FIG. 4, identical parts are represented by reference numerals identical to those used in FIG. 3. The internal electrodes 2a and 2b are formed so as to be extended over the whole surface of the thin plate 1 and a predetermined number of thin plates are superposed on each other similarly . to that described previously. Then, on one of the side surfaces of the laminate body 5 thus constructed, an insulating layer 4 made of an insulating material is disposed for every two layers, covering an edge of either ones of the internal electrodes 2a and 2b (e.g. only the internal electrodes 2b) and further the external electrode 3a made of a conductive material is disposed, covering the side surface including the insulating layer 4. On the other hand, on the other side surface of the laminate body 5, an insulating layer 4 is disposed on the edge of the internal electrodes (e.g. 2a), on which the insulating layer stated previously has not been disposed, similarly to that described above, and the other external electrode 3b is disposed on the other side surface including the insulating layer 4. The operation of the displacement device constructed as described above is identical to that described above, referring to FIG. 3. However, in a displacement device having such a construction, more uniform deformation can be obtained than that produced in the construction indicated in FIG. 3 and therefore no stress concentration takes place. Consequently a large amount of strain proper to that electromechanical material can be obtained and therefore it has an advantage that no destruction at deformation takes place.

SUMMARY OF THE INVENTION

An object of the present invention is to provide a laminate displacement device, for which fabrication is easy and which has a high insulating power and an excellent dampproof property and is not deteriorated, even if it is used for a long time.

Another object of the present invention is to provide a laminate displacement device, for which fabrication is easy and the insulating power thereof is not deteriorated, even if it is used in a high temperature region for a long time.

The printing method, the applying method, etc. are used for disposing the insulating layer 4 made of an insulating material at the edges of the internal electrodes 2a and 2b, as indicated in FIG. 4 described above. However, in the case where these methods are used, an insulating material having a fluidity should be used and it is difficult to form stably a fine insulating layer 4 and to control the thickness of the application. For this reason, fluctuations in the shape and the size of the insulating layer 4 cannot help being great. This gives rise a problem that when the size in the thickness or the size in the width of the insulating layer 4 is great, this hinders deformation of the device and on the contrary, when the size in the thickness or the width is small, this lowers the withstand voltage.

In order to solve the problem described above, a method is proposed by which the insulating layer 4 is formed by the electrophoresis, using glass powder (e.g. refer to JP-B-63-17355, JP-B-63-18351 to 18353). According to these propositions it is discribed that it is possible to form the insulating layer 4 stably and with a high precision and that simultaneous processing of a great lot of devices. However they have a problem that the creeping distance between the positive and the negative electrode is limited by the size in the width of the insulating layer.

In order to solve this problem, the applicant of this application has already invented a technique, by which insulating layers made of an insulating material are formed on side surfaces of a laminate body so as to traverse the internal electrodes and external electrodes are formed, after having formed grooves therein by means of a dicer, etc. at positions corresponding to every two internal electrodes (Refer to JP-A-3-155180.).

An internal electrode made of an conductive material is formed on a surface of a thin plate made of a material having an electromechanical converting function. Next a laminate body is formed by superposing thin plates, on the surface of each of which the internal electrode is formed, on each other. On side surfaces of this laminate body insulating layers are disposed as to traverse the side surfaces of these internal electrodes. Then grooves are formed therein at the positions on the insulating layers corresponding to the side surfaces of the internal electrodes. Further external electrodes are disposed on the insulating layers so as to traverse the grooves described above. In this way it is possible to connect the external electrodes and the internal electrodes with each other, making them correspond to each other. Next leads supplying voltages to them are connected with the external electrodes. The width of the grooves formed in the insulating layers described above is smaller than 2t, preferably t, t denoting the thickness of the thin plate.

Owing to the construction described above, since communication of the side surfaces of the laminate body with atmosphere is interrupted, penetration of humidity in the atmosphere is almost completely prevented. Further deterioration of the electrodes due to migration, etc. is prevented.

As indicated above, a laminate displacement device according to the present invention is easily fabricated, has a high insulating power and an excellent dampproof property and is not deteriorated, even if it is used for a long time.

Further, by the laminate displacement device according to the present invention, since the creeping distance between the electrodes increases with respect to the prior art type device indicated in FIG. 4, an effect can be obtained that the insulating power is increased.

Recently laminate displacement devices are used often in a high temperature region of about 150° C. In the laminate displacement device according to the present invention, in general, inorganic glass is used for the material constituting the insulating layers. In the case where such inorganic glass is used in the high temperature region described above, it happens that inorganic glass reacts with glass fit in the external electrodes and that the conductive component constituting the external electrodes penetrates in the insulating layers, which gives rise to insulation defects. Further it happens that inorganic glass flows out at the baking and it is difficult to form it in a predetermined size in the thickness. Further such an insulating layer is lacking in elasticity and cracks can be produced by expansion and contraction of the thin plates. Still further there is a problem that defects are apt to be produced at worked portions, when the grooves are formed in the insulating layers, which gives rise to insulation defects.

The laminate displacement device according to the present invention will be explained below, which is not only capable of solving the problem described above, maintaining the insulating resistance at a high level, even if it is used in a high temperature region, but also easily fabricated.

That is, for a laminate displacement element, for which a plurality of thin plates made of an electromechanical converting material and a plurality of internal electrodes made of a conductive material formed so as to have an approximately identical planar contour and contact area are superposed alternately on each other to form a laminate body and a pair of external electrodes are disposed on side surfaces of this laminate body, each of which is to be connected with every other internal electrode, a technique is adopted, by which the insulating layer disposed between each of the external electrodes and the internal electrodes, which should be isolated therefrom in a non-connected state, is made of a crystalline inorganic material containing Pb converted into PbO of 5.0 to 45.0 wt. %.

Further another technique is adopted, by which a reaction layer produced at the interface between the insulating layers disposed between the external electrodes and the internal electrodes so as to isolate them in a non-connected state and the thin plates described above is formed in a thickness smaller than 2 μm.

In the invention described above, it is not preferable that the amount of Pb converted into PbO is smaller than 5.0 wt. %, because in this case the action suppressing the reaction layer produced between the insulating layers and the thin plates cannot be satisfactorily expected. On the contrary, it is not convenient that the amount of the converted into PbO exceeds 45 wt. %, because in this case not only breaking thereof takes place easily at working due to excessive glass component but also it reacts with glass fit in the external electrodes and conductive component prenetrates into the insulating layers, which lowers the insulating resistance. More preferably, the range of the amount of Pb converted into PbO is 20–40 wt. %. Furthermore it is not preferable that the thickness of the reaction layer exceeds 2 μm, because it lowers the insulating resistance. More preferably, the thickness of the reaction layer is less than 1 μm.

By the construction described above it is possible not only to suppress extraction of Pb from the thin plates by the insulating layers but also to raise the production temperature of the reaction layer generated therebetween and thus to increase the insulating resistance while maintaining the electromechanical converting characteristics.

As explained above, following effects can be obtained by improving further the invention described above.

(1) Since the insulating layers are made of a crystalline inorganic material, it is possible to eliminate completely reaction thereof with glass frit in the external electrodes, flow out at the baking, and generation of defects such as cracks at working, breaking at mechanical work, etc.

(2) Since PbO is contained in the insulating layers, it is possible to prevent deterioration in the function of the laminate displacement device due to extraction of PbO from the materials constituting the laminate body and/or generation of the reaction layer at the interface.

(3) Since it has a high insulating power not only at the room temperature, of course, but also particularly at a high temperature region, it is useful for use in a high temperature region.

(4) Since no special means are required for forming the insulating layers and for preparing the crystalline inorganic material, but conventional means can be used therefor, fabrication thereof is easy.

BRIEF DESCRIPTION OF THE DRAWINGS

FIG. 1A is a photograph showing grain structure in the neighborhood of the interface between the insulating layers and the thin plates in an embodiment, in which PbO is added in the insulating layers of a laminate displacement device according to the present invention:

FIG. 1B is a photograph showing grain structure in the neighborhood of the interface between the insulating layers and the thin plates in an embodiment, in which no PbO is added in the insulating layers of a laminate displacement device to the present invention.

DESCRIPTION OF THE PREFERRED EMBODIMENTS

Figure 3:
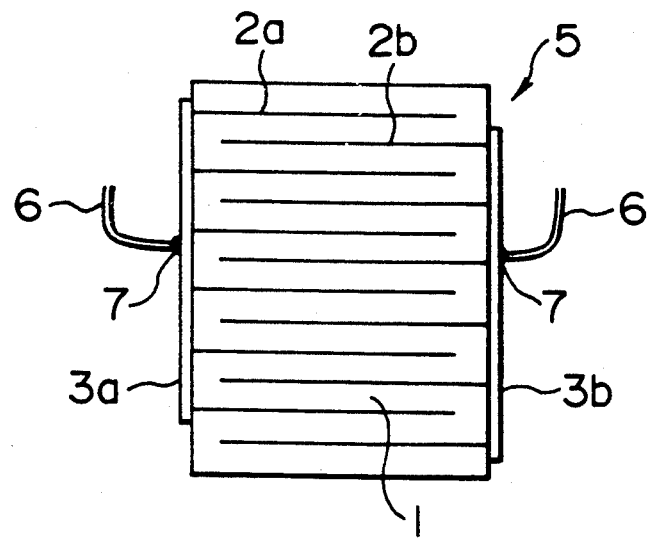
FIG. 3 is a scheme for explaining a prior art laminate displacement device (alternate electrode type)
Figure 4:
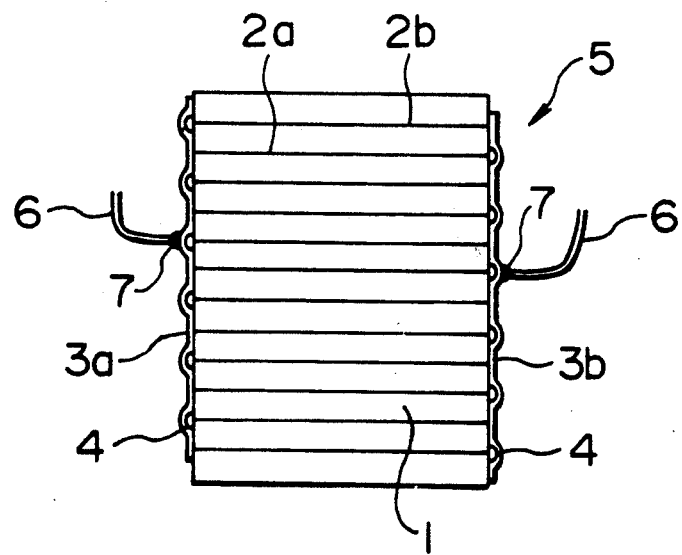
FIG. 4 is a scheme for explaining another prior art laminate displacement device (whole surface electrode type)
Figure 5A:
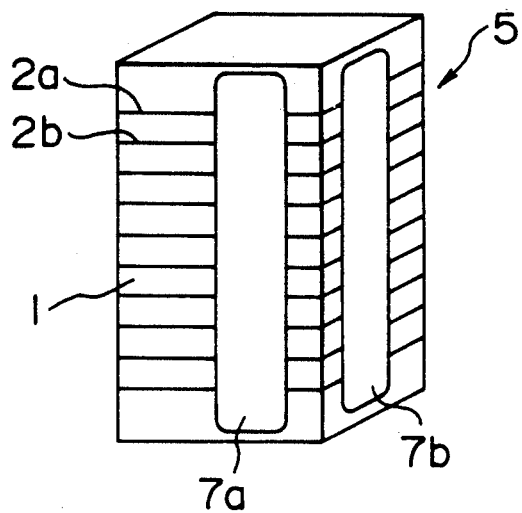
FIGS. 5A and 5B are perspective views for explaining fabrication steps of a laminate displacement device according to the present invention.
Figure 5B:
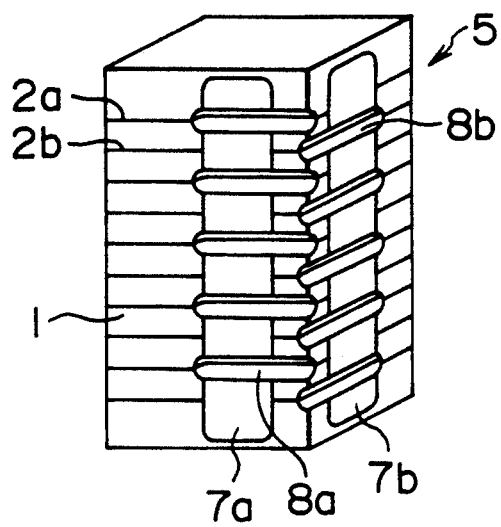
Figure 5C:
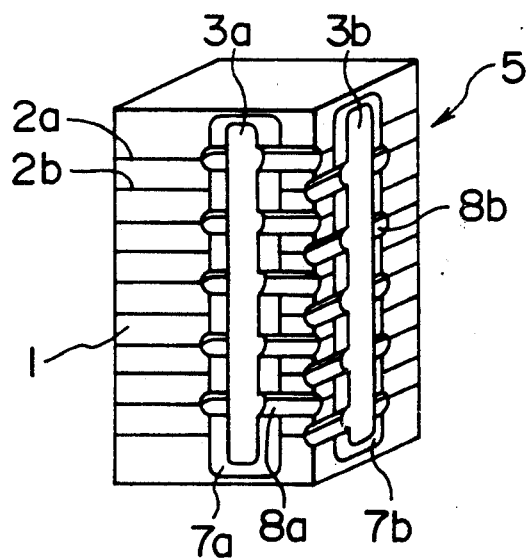
FIG. 5C is a perspective view for explaining the laminate displacement device according to the present invention.

FIGS. 5A to 5C are perspective views showing the principal part of the present invention, in which parts identical to those indicated in FIGS. 3 and 4 are denoted by the same reference numerals. In FIGS. 5A to 5C, for example, at first raw material consisting of e.g. $PbO$ 62.36%, $SrCO_3$ 4.54%, $TiO_2$ 11.38%, $ZrO_2$ 20.60% and $Sb_2O_3$ 1.12% in wt. % is provisionally baked for one hour at 800° C. after having mixed them in a bowl mill. After having pulverized powder thus provisionally baked, polyvinyl butylal is added thereto. This mixture is dispersed in trichloroethylene to be made slurry and this mixed material is formed in a sheet-shaped thin plate 100 μm thick by the doctor blade method.

Then e.g. platinum conductive paste on silver-palladium paste for forming internal electrodes 2a and 2b is screen-printed on a whole surface of this thin plate 1. For example 100 thin plates 1 having the internal electrodes 2a and 2b formed as described above are superposed on each other so that the thin plate and the internal electrode are alternate and bound together by pressure.

Figure 5D:
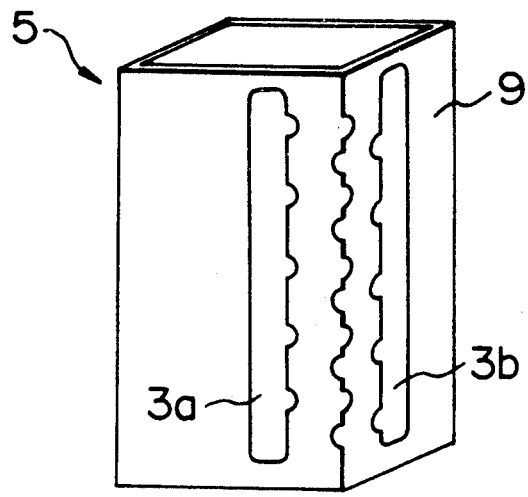
FIG. 5D is a perspective view for explaining a state, where the laminate displacement device according to the present invention is covered by a coating film.
Figure 5E:
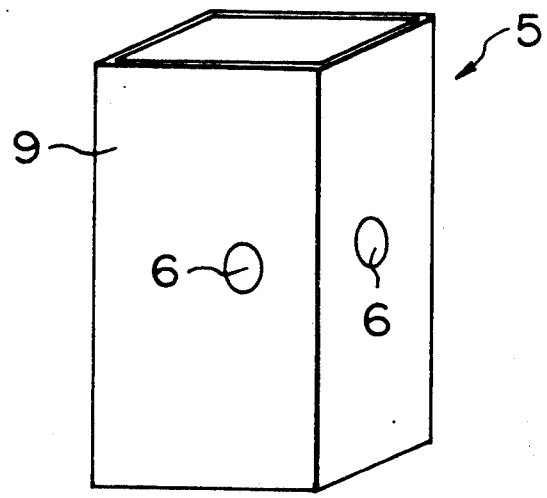
FIG. 5E is a perspective view for explaining another state, where the laminate displacement device according to the present invention is covered by a coating film.

Thereafter this is cut in a predetermined size and shape to obtain laminate bodies. After having eliminated binder at 500° C., it is sintered for 1 to 5 hours at a temperature of 1050° to 1200° C. in an oxygen atmosphere. Then it is cut in a predetermined size to form the laminate body 5. The size of this laminate body is e.g. 5×5×10 l(mm) or 10×10×10 l(mm) wherein denotes length. Next insulating layers 7a and 7b made of an insulating material are formed on side surfaces adjacent to each other of this laminate body 5 so as to traverse the internal electrodes 2a and 2b. In FIG. 5B, 8a and 8b represents grooves, which are formed at positions on the insulating layers 7a and 7b corresponding to the internal electrodes 2a and 2b, respectively, e.g. by means of a dicer, etc. In FIG. 5C, when external electrodes 3a and 3b are formed on the insulating layers 7a and 7b so as to traverse the grooves 8a and 8b, respectively, the external electrodes 3a and 3b and the internal electrodes 2a and 2b can be connected, making correspond them to each other. Next the whole laminate body is covered by a coating film 9, as indicated in FIG. 5D, and the external electrodes 3a and 3b are connected with leads for supplying voltages through solder. It is preferable to form the coating film 9 as follows. Fine powder consisting of inorganic materials such as e.g. $SiO_2$, $Al_2O_3$, glass, etc. is mixed with liquid binder to obtain a paste-like mixture. This mixture is applied to the laminate body at a thickness of several μm and dried. It is applied two times further thereon and 3 layers thus obtained are polymerized together. After having soldered the external electrodes with the leads, the side surfaces of the laminate body 5 are covered further e.g. with epoxy resin. At this time, the whole side surfaces of the laminate body may be covered with the coating film 9 except for the leads 9a and 9b.

Owing to the construction described above an effect can be obtained that it is possible to increase the creeping distance between the electrodes with respect to that indicated in FIG. 4 and thus the insulating power is increased.

Second embodiment

Recently there is a requirement to use a laminate displacement element in a high temperature region, e.g. at 150° C. It was recognized that there were several points, which are further to be improved, also in the invention described above. That is, in FIGS. 5A to 5C, there are disposed the insulating layers 7a and 7b between the external electrodes 3a and 3b and the internal electrodes 2b and 2a, which are to be isolated in a not connected state, respectively. In general, inorganic glass is used as the material for forming the insulating layers 7a and 7b. In the case where such inorganic glass is used in the high temperature region, the insulating layers 7a and 7b can react with glass frit in the external electrodes 3a and 3b disposed thereon and thus conductive component constituting the external electrodes 3a and 3b can penetrate into the insulating layers 7a and 7b, which produces insulation defects. Further, since inorganic glass flows out at the baking, it is difficult to form the insulating layers 7a and 7b in a predetermined size in the thickness. Still further, since the insulating layers 7a and 7b are lacking in the elasticity, it happens that cracks are produced by extension and contraction of the thin plate 1, which leads to insulation defects. Furthermore, breaking is apt to be produced in the neighborhood of worked portions, when the grooves 8a and 8b are formed in the insulating layers 7a and 7b, respectively. As the result it has problems that insulation defects can be easily produced, etc. In the case where the insulating layers 7a and 7b are made of a usual ceramic material in stead of the inorganic glass described above, since the baking temperature is high (800°-850° C.), side surfaces adjacent to each other and baked at a temperature of 800° to 850° C. to form the insulating layers 7a and 7b (refer to FIG. 5A). In this case, it is not preferable that the baking temperature is below 800° C., because the sintering of the insulating layers 7a and 7b is not sufficient. On the contrary, it is inconvenient that the baking temperature exceeds 850° C., because PbO is evaporated from the electromechanical converting material constituting the laminate body 5 and thus the electromechanical converting characteristics are worsened. Next grooves 8a and 8b are formed, as indicated in FIG. 5B, e.g. by means of a dicer. Then silver paste is screen-printed thereon, as indicated in FIG. 5C and baked at a temperature of 600° to 800° C. The external electrodes 3a and 3b are formed finally leads (not shown in the figure) are soldered thereto to obtain an final device. Results of evaluation of devices thus fabricated are indicated in the table together.

| No. | Amount of Pb converted into PbO (wt. %) | Easiness of cutting grooves | Insulating resistance (MΩ) 25° C. | Insulating resistance (MΩ) 150° C. | Thickness of reaction layer (μm) | Result of drive durability test |
|---|---|---|---|---|---|---|
| 1 | 0 | ○ | 1050 | 150 | 10 | insulation breakdown |
| 2 | 3 | ○ | 1300 | 180 | 4 | " |
| 3 | 5 | ○ | 1700 | 300 | 2 | normal |
| 4 | 10 | ○ | 2000 | 500 | 1.5 | " |
| 5 | 20 | ○ | 2500 | 550 | 1.0 | " |
| 6 | 30 | ○ | 4500 | 900 | 0.7 | " |
| 7 | 40 | ○ | 5500 | 1500 | 0.3 | " |
| 8 | 45 | ○ | 5000 | 1100 | 0.1 | " |
| 9 | 50 | X | 2000 | 430 | 0.1 | insulation breakdown |

PbO in the piezo-electric ceramic material constituting the laminate body 5 is evaporated at the baking, which worsens the piezo-electric characteristics. Further it has a problem that the insulating resistance is deteriorated during drive of the device, which can be led to breakdown of insulation, because a reaction layer is produced at the interface between the insulating layers and the thin plates 1 made of a piezo-electric ceramic material.

Now another laminate displacement device will be explained below, which is not only capable of solving the problem described above, maintaining the insulating resistance at a high level, even if it is used in a high temperature region, but also easily fabricated.

For example, by the technique already explained, a laminate body 5 of e.g. 5×5×10 l(mm) as indicated in FIG. 5A is formed. A basic composition indicated below is used as the inorganic material for forming the insulating layers 7a and 7b.

| Basic composition | | |
|---|---|---|
| | BaCO3 | 20 wt. % |
| | TiO2 | 13 wt. % |
| | ZrO2 | 3 wt. % |
| | Al2O3 | 17 wt. % |
| | SiO2 | 30 wt. % |
| | ZnO | 17 wt. % |

Pb3O4 or PbO is added thereto e.g. with different ratios given in a table indicated later.

The basic composition described above is an insulating material for electronic parts used for cross coating dielectric substance for thick film circuit substrates, etc. This material, to which Pb3O4 or PbO stated above is added, is provisionally baked at 700° C. after having mixed them in a bowl mill. Powder thus obtained is pulverized further by means of the bowl mill. Methyl cellulose and solvent are added to this powder, which is kneaded to be made paste-like. This is screen-printed on As clearly seen from the table, for No. 1 containing no PbO in the insulating layers 7a and 7b indicated in FIGS. 5A to 5C, the reaction layer produced at the interface between the insulating layers 7a and 7b and the thin plates 1 is 10 μm thick and the insulating resistance is lowered. The reaction layer stated above becomes thinner and the insulating resistance increases with increasing amount of Pb converted into PbO. However, for No. 9, since the amount of the converted into PbO is excessive, glass component in the insulating material is excessive, breaking at working the grooves 8a and 8b in FIG. 5B is easily produced and it is difficult to fabricate the device. Further the insulating layers 7a and 7b react with glass frit in the external electrodes 3a and 3b indicated in FIG. 5C and conductive component penetrates thereinto, which lowers the insulating resistance. For No. 2, not only the amount of Pb converted into PbO is insufficient, but also the reaction layer is 4 μm thick and the insulating resistance is also low. On the other hand, all of Nos. 3 to 8 have high insulating resistance.

Next accelerated durability tests, by which a DC voltage of 150 V is continuously applied to different devices at a temperature of 150° C., have been effected. Results thus obtained are indicated also in the table together. According thereto, for No. 1, No. 2 and No. 9, the insulating resistances were gradually lowered with the time and insulation was broken after 300 hr, 550 hr and 300 hr, respectively. That is, for the devices (No. 1 and No. 2) having thick reaction layers, ionized silver atoms in the external electrodes 3a and 3b indicated in FIG. 5C are diffused through the reaction layer towards the internal electrodes 2a or 2b on the negative pole side, which lowers the insulating resistance, and finally insulation breakdown takes place, due to the fact that a DC voltage is applied thereto at a high temperature. On the other hand, for No. 9, insulation breakdown is produced generation of cracks at forming the grooves 8a and 8b and reaction of the insulating layers 7a and 7b with glass frit in the external electrodes 3a and 3b. On the contrary, for Nos. 3 to 8 according to the present invention, the reaction layer is extremely thin and thus diffusion path for the ionized silver atoms described above is interrupted. After drive of 1000 hr there are no devices, for which insulation breakdown takes place. From the results described above it is recognized that the laminate displacement device according to the present invention is useful for those used in a high temperature region over 100° C. such as a device for a high temperature mass flow controller.

Figure 2A:
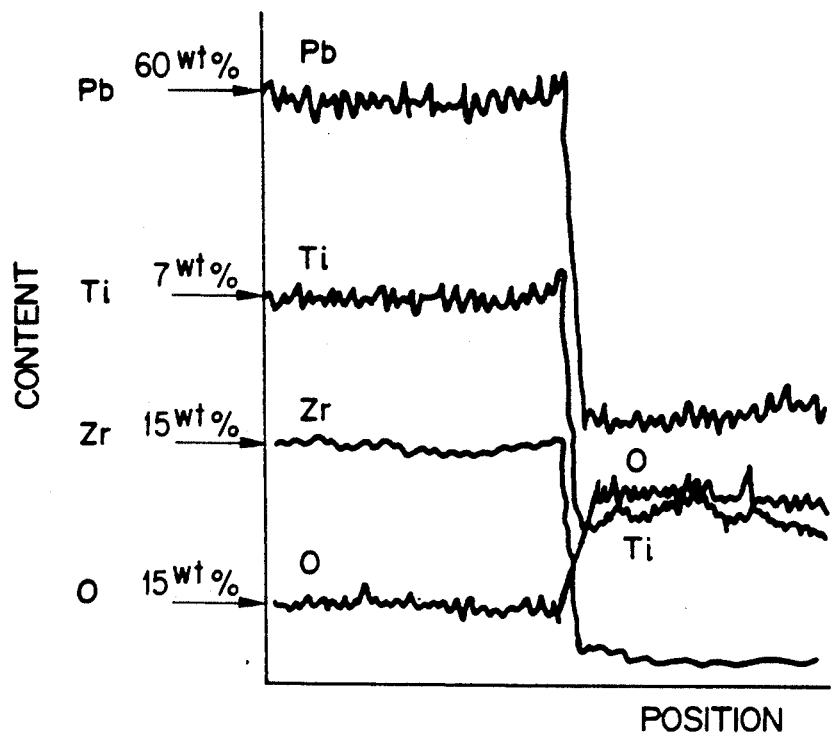
FIG. 2A is a graph indicating results of analysis of the neighborhood of the interface indicated in FIG. 1A by means of EPMA (Electron Probe Microanalyzer)
Figure 2B:
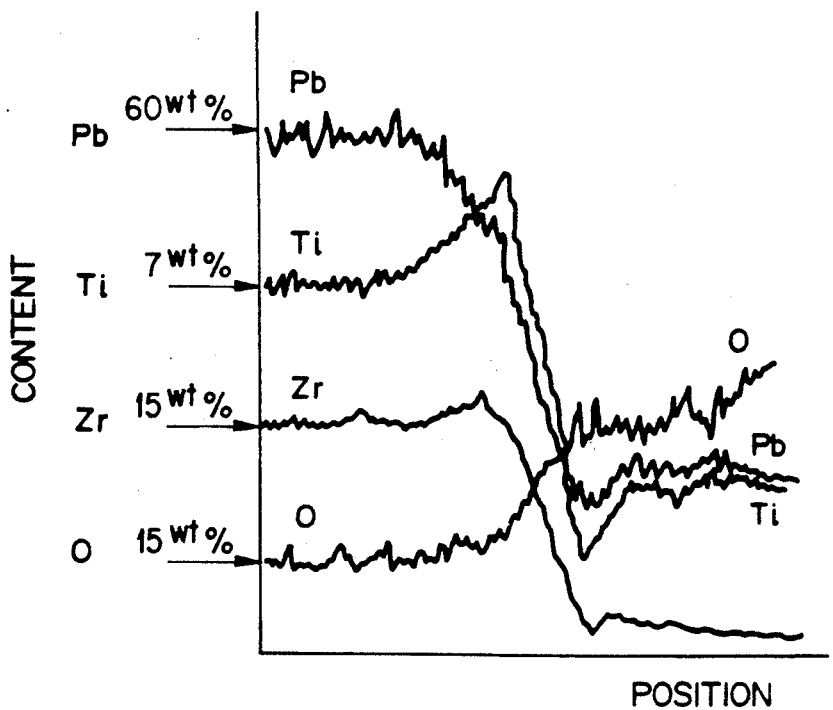
FIG. 2B is a graph indicating results of analysis of the neighborhood of the interface indicated in FIG. 1B by means of EPMA.

FIGS. 1A and 1B are photographs showing grain structure in the neighborhood of the interface between the insulating layers and the thin plates in the different embodiments. FIGS. 2A and 2B are graphs indicating results of analysis by means of EPMA (Electron Probe Microanalyzer) and they are so indicated that the positions thereof in the horizontal direction correspond to those of FIGS. 1A and 1B, respectively. FIGS. 1A and 2A relate to a device, in which $Pb_3O_4$ is added to the insulating layers at a ratio 32 wt. %, while FIGS. 1B and 2B relate to a device, in which no $Pb_3O_4$ is added thereto. The reference numerals used in FIGS. 1A and 1B correspond to those used in FIGS. 3 and 5.

In FIG. 1B, reference numeral 17 represents the reaction layer and it can be seen that it is porous due to extraction of Pb in the piezo-electric ceramic material constituting the thin plates to the insulating layer 7a side, and on the contrary, in FIG. 1A, the interface between the thin plate 1 and the insulating layer 7a is clearly recognized and there exists no reaction layer therebetween at all.

As described above, owing to the fact that the material constituting the insulating layer 7a contains PbO, it is possible to suppress the generation of the reaction layer 17 at the interface between the insulating layer 7a and the thin plate 1. This becomes clearer from FIGS. 2A and 2B. In FIG. 2B, the content of Pb decreases continuously in the reaction layer 17 between the thin plate 1 and the insulating layer 7a, while the content of Ti increases continuously. That is, the reaction layer 17 accompanying variations in the composition of the thin plate 1 and the insulating layer 7a is produced by the reaction therebetween. In this reaction layer 17 the contents of Pb and Ti vary, depending on the position in the horizontal direction, which indicates that Pb and Ti have moved. On the contrary, in FIG. 2A, the contents of these constitutent elements remain constant in the thin plate 1 and the insulating layer 7a. In addition they vary stepwise at the interface and no continuous variations depending on the position in the horizontal direction cannot be recognized. This result is in accordance with the result that the interface between the thin plate 1 and the insulating layer 7a is clearly recognized in FIG. 1A, which is a verification that no reaction layer exists therebetween.

Next, an insulating layer 7a was formed on a prior art laminate displatement device indicated in FIG. 4, using an inorganic material containing Pb converted into PbO described previously. That is, a paste-like material is prepared, which is similar to that used in the embodiment described above. It is screen-printed at the places, where the internal electrodes 2a and 2b are to be formed on the side surfaces of the laminate body 5. Then it is baked at a temperature of 800° to 850° C. to form the external electrodes 3a and 3b similarly to the embodiment described above. Finally the leads 6 are soldered thereto to form the device. Laminate displacement devices thus fabricated were evaluated. For those fabricated by using the insulating layer 4 and the materials of Nos. 3 to 8 in the table described above, it was recognized that the generation of the reaction layer is suppressed at the surface between the thin plate 1 and the insulating layer 4 and the device has a high insulating resistance similarly to the embodiment described previously. In this case, applying method, electrophoresis method and other well-known method other than the screen-printing method can be used for forming the insulating layer 4.

Although, in the present embodiment, an example was described, in which insulating ceramics of $SiO_2$-$Al_2O_3$-$BaO$-$ZnO$-$TiO_2$-$ZrO_2$ system was used as the crystalline inorganic material for forming the insulating layers 4, 7a and 7b, other crystalline inorganic materials may be used therefor, not restricted thereto. Further it is a matter of course that the present invention can be applied, regardless of the shape, the size and the fabrication method of the laminate displacement device.

What is claimed is:

1. A laminate displacement device comprising:
   a plurality of thin plates made of an electromechanical converting material for forming a laminate body;
   internal electrodes formed on a lamination surface of said thin plates, put between said thin plates in a sandwich shape, constituting said laminate body, exposed to side surfaces of said laminate body, and used alternately as electrodes of first conductivity type and second conductivity type;
   a first insualting layer formed on one side surface of said laminate body except for portions corresponding to the internal electrodes used for the electrodes of first conductivity type exposed on the side surface of said laminate body;
   a second insulating layer formed on another side surface of said laminate body except for portions corresponding to the internal electrodes used for the electrodes of second conductivity type exposed on the side surface of said laminate body;
   a first external electrode bridging electrically said internal electrodes used as the electrodes of first conductivity type exposed on the one side surface of said laminate body; and
   a second external electrode bridging electrically said internal electrodes used as the electrodes of second conductivity type exposed on the other side surface of said laminate body.

2. A laminate displacement device comprising:
   a plurality of thin plates made of an electromechanical converting material for forming a laminate body;
   one set of internal electrodes formed on a lamination surface of said thin plates, put between said thin plates in a sandwich shape, constituting said laminate body, exposed to side surfaces of said laminate body, and used alternately as electrodes of first conductivity type and second conductivity type;
   a first insulating layer made of a crystalline inorganic material containing Pb converted into PbO of 5.0 to 45.0 wt. %, formed on one side surface of said laminate body except for portions corresponding to the internal electrodes used for the electrodes of first conductivity type exposed on the side surface of said laminate body;

a second insulating layer made of a crystalline inorganic material containing Pb converted into PbO of 5.0 to 45.0 wt. %, formed on another side surface of said laminate body except for portions corresponding to the internal electrodes used for the electrodes of second conductivity type exposed on the side surface of said laminate body;

a first external electrode bridging electrically said internal electrodes used as the electrodes of first conductivity type exposed on the one side surface of said laminate body; and a second external electrode bridging electrically said internal electrodes used as the electrodes of second conductivity type exposed on the other side surface of said laminate body.

3. A laminate displacement device comprising:

a laminate body formed by superposing alternately a plurality of thin plates made of an electromechanical converting material and a plurality of internal electrodes made of a conductive material formed so as to have an approximately identical planar contour and contact area on each other;

a pair of external electrodes disposed on side surfaces of said laminate body, each of which is connected with every other electrode; and an insulating layer disposed between each of said external electrodes and the internal electrodes, which should be isolated from said external electrodes in a non-connected state, made of a crystalline inorganic material containing Pb converted into PbO of 5.0 to 45.0 wt. %.

4. A laminate displacement device comprising:

a laminate body formed by superposing alternately a plurality of thin plates made of an electromechanical converting material and a plurality of internal electrodes made of a conductive material formed so as to have an approximately identical planar contour and contact area on each other;

a pair of external electrodes disposed on side surfaces of said laminate body, each of which is connected with every other electrode; and insulating layers disposed between said external electrodes and said internal electrodes so as to isolate them from each other in a non-connected state, a reaction layer generated at the interface between said insulating layers and said thin plates being thinner than 2 μm.

* * * * *